United States Patent
Dekker et al.

(10) Patent No.: US 6,562,694 B2
(45) Date of Patent: May 13, 2003

(54) METHOD OF MANUFACTURING A SEMICONDUCTOR DEVICE COMPRISING SEMICONDUCTOR ELEMENTS FORMED IN A TOPLAYER OF A SILICON WAFER SITUATED ON A BURIED INSULATING LAYER

(75) Inventors: Ronald Dekker, Eindhoven (NL); Henricus Godefridus Rafael Maas, Eindhoven (NL); Cornelis Eustatius Timmering, Eindhoven (NL); Pascal Henri Leon Bancken, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 124 days.

(21) Appl. No.: 09/746,027

(22) Filed: Dec. 21, 2000

(65) Prior Publication Data

US 2001/0023114 A1 Sep. 20, 2001

(30) Foreign Application Priority Data

Dec. 24, 1999 (EP) .............................................. 99204548

(51) Int. Cl.[7] .............................................. H01L 21/76
(52) U.S. Cl. ...................... 438/424; 438/219; 438/221; 438/295; 438/296; 438/355; 438/359; 438/404
(58) Field of Search ................................ 438/219, 221, 438/295, 296, 355, 359, 404, 405, 424

(56) References Cited

U.S. PATENT DOCUMENTS

| | | | | |
|---|---|---|---|---|
| 4,274,909 A | * | 6/1981 | Venkataraman et al. | 438/296 |
| 4,897,703 A | * | 1/1990 | Spratt et al. | 257/586 |
| 5,059,547 A | * | 10/1991 | Shirai | 438/295 |
| 5,517,047 A | * | 5/1996 | Linn et al. | 257/347 |
| 5,872,044 A | | 2/1999 | Hemmenway et al. | 438/426 |
| 5,966,598 A | * | 10/1999 | Yamazaki | 438/221 |
| 6,133,610 A | * | 10/2000 | Bolam et al. | 257/349 |
| 6,184,105 B1 | * | 2/2001 | Liu et al. | 438/424 |
| 6,284,605 B1 | * | 9/2001 | Kim et al. | 438/268 |
| 6,309,958 B1 | * | 10/2001 | Okada | 438/624 |
| 2001/0014512 A1 | * | 8/2001 | Lyons et al. | 438/424 |

FOREIGN PATENT DOCUMENTS

| EP | 0813240 A1 | 12/1997 |
|---|---|---|
| GB | 2081506 A | 2/1982 |

OTHER PUBLICATIONS

Wolf et al., "Chemical Vapor Deposition of Amorphous and Polycrystalline Films," Silicon Processing for the VLSI Era—vol. 1: Process Technology, Lattice Press (1986), pp. 182–185.*

* cited by examiner

Primary Examiner—Amir Zarabian
Assistant Examiner—Toniae M. Thomas
(74) Attorney, Agent, or Firm—Aaron Waxler

(57) ABSTRACT

A method of manufacturing a semiconductor device including semiconductor elements having semiconductor zones (17, 18, 24, 44, 45) formed in a top layer (4) of a silicon wafer (1) situated on a buried insulating layer (2). In this method, a first series of process steps are carried out, commonly referred to as front-end processing, wherein, inter alia, the silicon wafer is heated to temperatures above 700° C. Subsequently, trenches (25) are formed in the top layer, which extend as far as the buried insulating layer and do not intersect pn-junctions. After said trenches have been filled with insulating material (26, 29), the semiconductor device is completed in a second series of process steps, commonly referred to as back-end processing, wherein the temperature of the wafer does not exceed 400° C. The trenches are filled in a deposition process wherein the wafer is heated to a temperature which does not exceed 500° C. In this manner, a semiconductor device can be made comprising semiconductor elements having very small and shallow semiconductor zones.

6 Claims, 5 Drawing Sheets

METHOD OF MANUFACTURING A SEMICONDUCTOR DEVICE COMPRISING SEMICONDUCTOR ELEMENTS FORMED IN A TOPLAYER OF A SILICON WAFER SITUATED ON A BURIED INSULATING LAYER

BACKGROUND OF THE INVENTION

The invention relates to a method of manufacturing a semiconductor device comprising semiconductor elements having semiconductor zones formed in a silicon wafer's monocrystalline top layer situated on a buried insulating layer, in which method a first series of process steps is carried out, inter alia, process steps wherein the wafer is heated to a temperature above 700° C., whereafter trenches are formed in the top layer which extend as far as the buried insulating layer and which do not intersect pn-junctions, which trenches are subsequently filled with an insulating material, after which a second series of process steps is finally carried out, wherein the semiconductor device is completed, in which second series of process steps the wafer does not exceed a temperature of 400° C.

In this method, for the starting material use is made of a wafer of silicon having a monocrystalline top layer situated on a layer of an insulating material buried in the wafer, said layer of insulating material generally being a layer of silicon oxide. This wafer is provided with semiconductor elements, such as bipolar transistors or MOS transistors. In the first series of process steps, semiconductor zones are formed in the top layer of this SOI (Silicon-On-Insulator) wafer, which semiconductor zones are of the opposite conductivity type which respect to the top layer, and, thus, form pn-junctions with said top layer. Insulating regions of silicon oxide are also often formed in the top layer by local thermal oxidation of said top layer. It is additionally possible to form layers of polycrystalline silicon, silicon oxide or silicon nitride on the top layer. This can be achieved by deposition or, alternatively, by chemical conversion of the surface of the top layer. In this first series of process steps, which form the "front-end" of the manufacturing process, the wafer is often heated to temperatures above 700° C., for example, to activate implanted ions, form silicon oxide by thermal oxidation or deposit layers. After this first series of process steps, trenches are formed in the top layer, which are subsequently filled with an insulating material. These trenches can be used, for example, to electrically insulate the semiconductor elements with respect to each other. In the second series of process steps, wherein the semiconductor device is completed, and which forms the "back-end" of the manufacturing process, a metallization which may comprise one or more layers of metal patterns and layers of insulating material is formed on the wafer. As a result of this metallization, the semiconductor elements are connected to one another. Finally, in practice, a few insulating layers and an envelope are provided. During this second series of processes, the wafer is only heated to temperatures which do not exceed said 400° C.

In U.S. Pat. No. 5,872,044, a description is given of a method of the type mentioned in the opening paragraph, wherein the trenches in the top layer are filled in two process steps. In the first step, the wall of the trenches is provided with a layer of silicon oxide by thermal oxidation. In the second step, the trench is further filled with polycrystalline silicon or silicon oxide.

As the trenches are not formed and subsequently filled until after said "frontend" process steps have been carried out, it is achieved that the filled trenches are not subjected again to the high temperatures at which these process steps are often carried out. If the trenches were formed and filled prior to carrying out the "front-end" processes, then mechanical stresses capable of causing undesirable crystal errors in the top layer would occur in the part of the top layer surrounded by the trenches due to heating of such filled trenches. The formation of said crystal errors is precluded because the trenches are not formed and subsequently filled until after the "front-end" processes have been carried out.

As the semiconductor elements are formed in a SOI wafer, a good vertical insulation of the semiconductor elements is achieved. As a result, the known method described above seems to be very suitable for the manufacture of semiconductor devices comprising semiconductor elements which can suitably be used to process high-frequency signals. However, in the manufacture of semiconductor devices used to process signals having frequencies above 10 GHz, it has been found that the known, above-described method is unsatisfactory. In the case of semiconductor elements which can suitably be used to process signals having such high frequencies, the semiconductor zones must be small and shallow, and also the interspace between the semiconductor zones should be small. To preclude mutual differences between the transistors, these small and shallow semiconductor zones should additionally be equally large and equally deep everywhere, viewed over the wafer. A bipolar transistor which can suitably be used to process such signals must, for example, have an n-type emitter zone having lateral dimensions of approximately 400 nm and a depth of approximately 50 nm, which emitter zone is formed in a p-type base zone having a depth of 200 nm, the thickness of the base zone then being 150 nm. These zones can be formed, for example, in an n-type top layer having a thickness of approximately 800 nm. When the known method is used, it is practically impossible to manufacture such transistors having said small emitter and base zones. In particular, it has been found to be practically impossible to manufacture emitter zones having such a small depth.

SUMMARY OF THE INVENTION

It is an object of the invention to provide a method which can be carried out more readily than the known method and which, in addition, makes it possible to manufacture semiconductor elements which are suitable to process signals having frequencies above 10 GHz. The invention particularly aims at providing a method which can suitably be used to manufacture semiconductor zones having a very small depth of, for example, less than 50 nm.

To achieve this, the method is characterized in accordance with the invention in that the trenches are filled with an insulating material by means of a deposition process in which the wafer is not heated to a temperature above 500° C.

In the above-described, known method, the walls of the trenches are provided with an approximately 50 nm thick layer of silicon oxide by thermal oxidation of the toplayer's silicon adjoining these walls. To this end, the wafer must be heated to a temperature of 900° C. for, for example, 30 minutes. Subsequently, the trenches are filled with polycrystalline silicon or silicon oxide. For this purpose, the wafer must be heated for several hours to a temperature of approximately 700° C. It has been found that such temperature treatments impede the formation of the desired shallow semiconductor zones.

In the known method, the wall of the trenches is provided with a very dense layer of thermally formed silicon oxide which will very well passivate the "dangling bonds" present on the wall of the trenches. The invention is based on the recognition that this is not necessary. As the trenches do not intersect pn-junctions, the trenches can be directly filled with insulating material without their walls being provided with a layer of a thermal oxide first. It has been found that a good mutual insulation of the semiconductor elements can be achieved if the trenches are filled with an insulating material whose density is smaller than that of thermally formed silicon oxide. Such a lower-quality insulating material can be readily deposited at temperatures below 400° C.

In a first example, the trenches are filled by depositing, in the trenches and next to the trenches, a layer of a synthetic resin on the wafer, whereafter windows are formed in this layer, which serve to make contact with the semiconductor elements situated under the layer. Preferably, said synthetic resin layer is a layer of benzocyclobutene (BCB). Such a layer can be provided by means of a customary spin-coating process. In this manner, the trenches are filled in a simple and inexpensive manner.

In a second example, the trenches are filled by depositing, in the trenches and next to the trenches, a silicon oxide layer on the wafer from a plasma generated in a vapor of silicon and oxygen-containing components. Said layer of silicon oxide is preferably deposited from a plasma generated in a vapor of silane and laughing gas. During the deposition of such a layer, the wafer does not reach temperatures above 400° C. This method has the additional advantage that, apart from the semiconductor elements, passive elements, such as capacitors and coils, can be provided on the layer,. These passive elements are insulated from the underlying silicon wafer by the layer of silicon oxide deposited as described above.

Preferably, the deposited layer of silicon oxide is planarized by means of a chemical-mechanical polishing process. In such a process, which is carried out at room temperature, the wafer is not heated. In addition to the semiconductor elements, the metallization and said passive element can be readily formed on the layer thus planarized. Preferably, at the location of the passive elements, the insulating buried layer is exposed in the process step wherein the trenches are formed, prior to the deposition of the silicon oxide layer. The passive elements are thus provided on a layer of planarized silicon oxide which, at the location of these passive elements, is directly provided on the insulating buried layer. As a result of the absence of the doped top layer, these passive elements will exhibit a better high-frequency behavior than passive elements formed at locations where the top layer has not been removed. For example, coils will exhibit a higher quality factor.

BRIEF DESCRIPTION OF THE DRAWINGS

These and other aspects of the invention will be apparent from and elucidated with reference to the embodiments described hereinafter.

In the drawings.

DETAILED DESCRIPTION OF THE INVENTION

Figure 1:
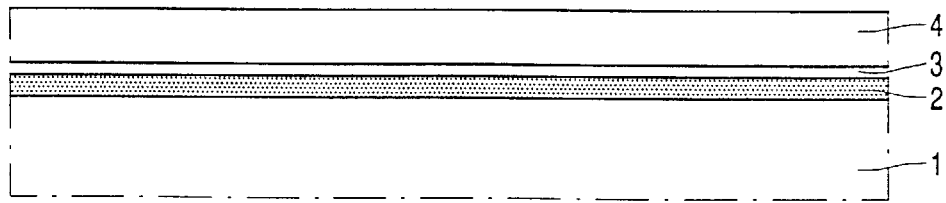
FIG. 1 through FIG. 10 are diagrammatic, cross-sectional views of a few stages in the manufacture of a first example of a semiconductor device comprising a bipolar transistor, using the method in accordance with the invention.
Figure 2:
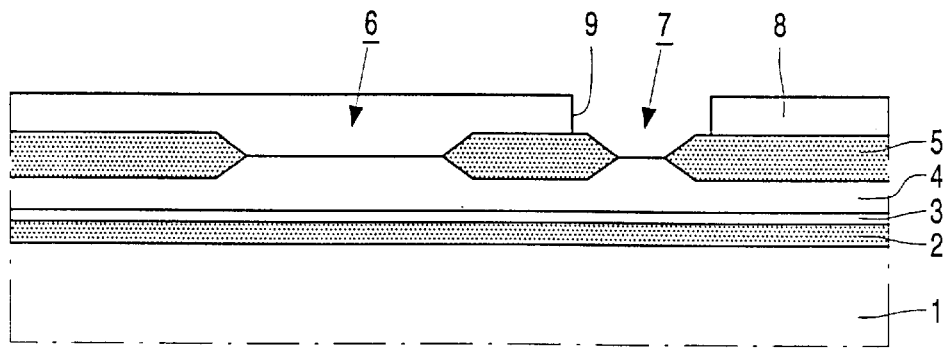
Figure 3:
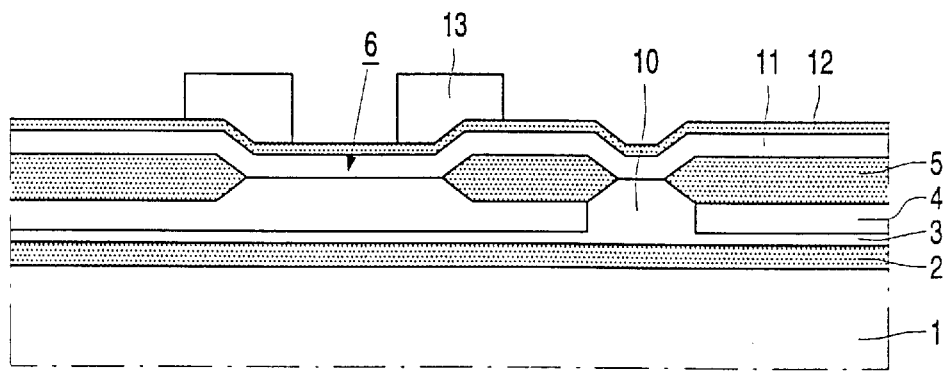
Figure 4:
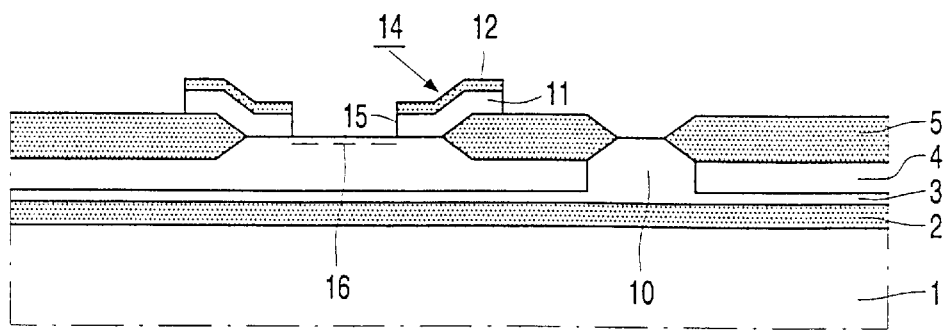
Figure 5:
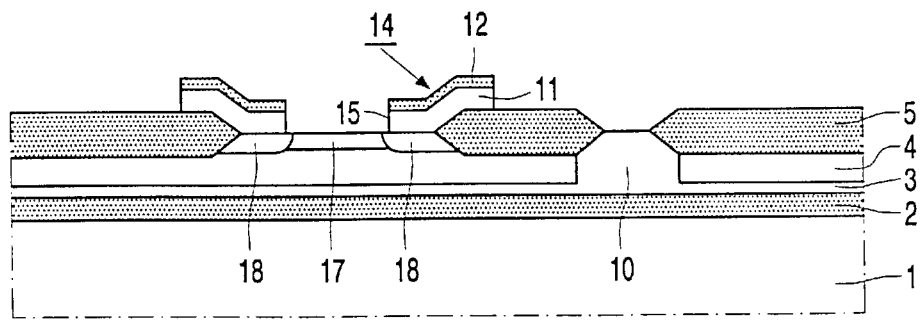

FIGS. 1 through 10 are diagrammatic, cross-sectional views of a few stages in the manufacture of a first example of a bipolar transistor. The Figures show the manufacture of a single transistor, but it will be clear that in practice a semiconductor device may comprise a large number of such transistors. The starting material used in the method is a silicon wafer 1 comprising a layer of insulating material 2 buried in the wafer, in this case a buried layer of silicon oxide, on which an approximately 100 nm thick layer 3 of monocrystalline silicon is situated which is n-type doped with approximately $10^{20}$ atoms per cc. An approximately 800 nm thick top layer 4 is epitaxially formed on the layer 3, said top layer 4 being lightly n-type doped, in this example, with approximately $5.10^{15}$ atoms per cc. This doping serves as the doping of the collector of the transistor to be formed.

First, 2 approximately 600 nm thick oxide regions 5 are formed in the top layer, in a customary manner, by means of local oxidation of the top layer. These oxide regions 5 enclose an active region 6 and a connection region 7 for the transistor's collector to be formed. In the formation of the oxide regions 5, the wafer 1 is heated by exposure to steam to a temperature of 1000° C. for approximately 100 minutes, after an oxide mask, not shown, has been formed on the top layer in a customary manner.

After the formation of the oxide regions 5, a photoresist mask 8 is provided which comprises a window 9 at the location of the connection region of the collector to be formed. Through the window 9, ions are implanted in the top layer. Subsequently, the connection zone 10, which is connected to the heavily n-type doped layer 3, is formed by a heat treatment at 900° C. for 30 minutes.

Subsequently, after the removal of the photoresist mask 8, an approximately 300 nm thick layer of p-type doped polycrystalline silicon 11 and a layer of an insulating material 12, in this case an approximately 300 nm thick layer of silicon oxide, are deposited. Both layers are deposited by means of a customary CVD process, wherein the wafer 1 is heated to a temperature of 700° C. for approximately 2 hours in a customary CVD reactor chamber. Doping of the layer of polycrystalline silicon 11 may be carried out during the deposition or after the deposition by means of ion implantation. A photoresist mask 13 is formed on the silicon oxide layer 12, whereafter the layers of polycrystalline silicon 11 and silicon oxide 12 are etched in accordance with a pattern which corresponds to the photoresist mask 13. A strip 14 having a rectangular, square window 15 and extending transversely to the plane of the drawing is etched in the layers 11 and 12, the length of said strip transverse to the plane of the drawing being a few μm and the width being approximately 800 nm.

After the removal of the photoresist mask 13, ions, diagrammatically indicated by means of a dotted line 16, are implanted in the top layer 4 to form the base zone of the transistor. Subsequently, a heat treatment is carried out in which the wafer is heated in an inert atmosphere for approximately 30 minutes to a temperature of approximately 900° C. In this process, the base zone 17 is formed and, in addition, connection zones 18 for the base zone 17 are formed by diffusion of ions from the layer of polycrystalline silicon 11, which connection zones 18 border on the window 15 formed in the layers 11 and 12. The base zone 17 thus formed has a depth of approximately 200 nm and is doped with an n-type doping having a doping concentration of $5.10^{17}$ atoms per cc.

Figure 6:
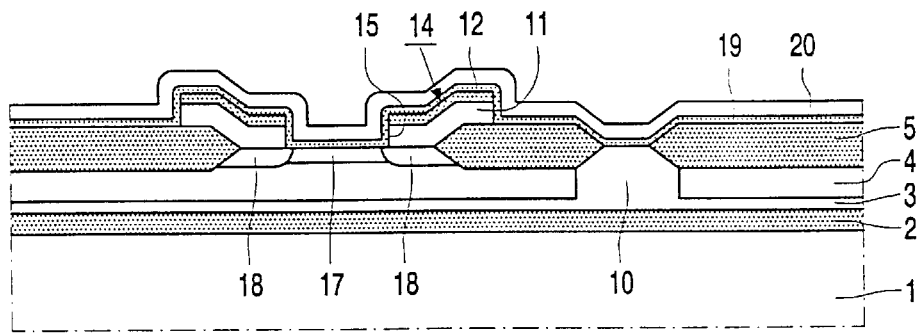
Figure 7:
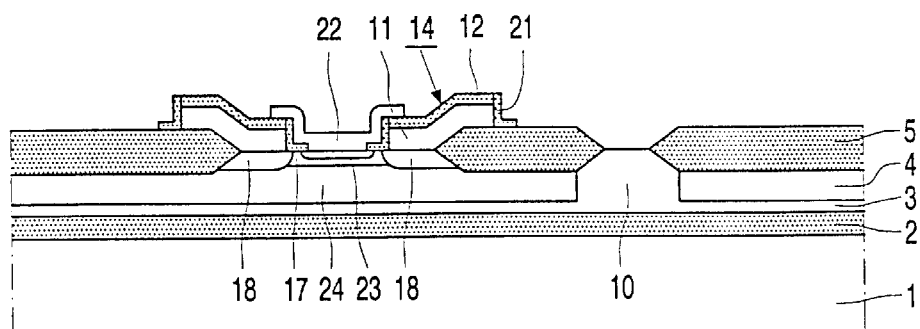

Subsequently, as shown in FIG. 6, an approximately 50 nm thick layer of silicon nitride 19 and an approximately 200 nm thick layer of amorphous silicon 20 are successively deposited. The layer of amorphous silicon 20 is anisotropically etched until the layer of silicon nitride 19 is exposed. Edges of amorphous silicon then remain on the wall of the window 15 and on the walls of the strip 14. Next, the layer of silicon nitride 19 is etched, in which process the edges of amorphous silicon are used as masking members. After removal of these edges, L-shaped edges 21 of silicon nitride remain on the wall of the window 15 and on the walls of the strip 14, as shown in FIG. 7. As a result, within the window 15, a surface of the top layer 4 having a width of approximately 400 nm remains uncovered.

Subsequently, an n-type doped layer of polycrystalline silicon is deposited on the pattern, wherein the p-type doped layer of polycrystalline silicon 11 and the layer of insulating material 12 situated thereon are etched, and in the window 15 formed therein after its wall has been provided with the insulating edge 21. In this example, this layer is doped, during the deposition, with arsenic having a doping concentration of approximately $10^{21}$ atoms per cc. In this layer, a conductor track 22 is etched. Said conductor track 22 serves to make contact with the emitter zone to be formed.

Subsequently, the emitter zone 23 of the transistor is formed by diffusion of dopant from the conductor track 22. To this end, the wafer is heated to a temperature of 900° C. for approximately 10 seconds. The emitter zone thus formed has a depth of approximately 50 nm. The collector of the transistor is formed by the part 24 of the top layer 4 situated underneath the base zone 17. The collector zone 24 can be contacted by the connection zone 10 and via the layer 3 situated underneath the collector zone.

In the above-described first series of process steps, which constitute the "frontend" of the manufacture of the semiconductor device, the wafer is heated a number of times to temperatures above 700° C. After this series of process steps constituting the "front-end" of the manufacture, trenches 25 are formed in the top layer 4 which extend as far as the buried layer 2, and which do not intersect pn-junctions, which trenches 25 are subsequently filled with an insulating material 26. Subsequently, a second series of process steps is carried out wherein the semiconductor device is completed, said second series constituting the "backend" of the manufacturing process. In this second series of process steps, the wafer does not exceed a temperature of 500° C. In this first example, the trenches are filled by depositing, in and next to the trenches 25, a layer of a synthetic resin 26 on the wafer 1. Preferably, a layer of benzocyclobutene (BCB) is deposited. This material exhibits a low dielectric constant and can be provided by means of a customary spin-coating process. The trenches are thus filled in a simple and inexpensive manner.

After the trenches 25 have been filled, contact windows 27 are formed in the layer, and, subsequently, a metallization with conductor tracks 28 is formed in a customary manner on the layer 26 to interconnect the semiconductor elements. Such a metallization is formed, for example, in a layer of aluminium. After the provision of this metallization, in practice, a few more insulating layers are provided, whereafter the semiconductor device is provided with an envelope. In the process steps carried out after the trenches 25 have been formed, the wafer is not heated to a temperature above 500° C.

In this example, as well as in the examples which will be described hereinafter, the trenches are filled with a material which can be deposited at temperatures below 500° C. Such materials generally are of less quality than the silicon oxide which is often used to cover walls of trenches, and which is obtained by thermal oxidation of the walls of the trenches. A layer of thermal silicon oxide serves to passivate the dangling bonds present at the wall of the trenches. To cover the walls of the trenches with a layer of thermal silicon oxide of suitable thickness, the wafer must be heated for 30 minutes to 900° C. However, such a high-quality cover is not necessary because the trenches 25 do not intersect pn-junctions. It has been found that the above-described filling of the trenches, which will hereinafter also be described with reference to other examples, provides for a sufficient mutual insulation of semiconductor elements.

Since the trenches 25 are filled at a low temperature, i.e. below 400° C., no further diffusion of dopant from the previously formed base zone 17 and emitter zone 23 takes place. The above-mentioned dimensions of the base and emitter zone 17 and 23 are not increased during the process steps carried out after the formation of these zones. As a result, a bipolar transistor can be formed whose dimensions are so small that signals having frequencies above 10 GHz can be processed. This would not be possible if a layer of thermal silicon oxide was provided first on the walls of the trenches, as described hereinabove. By heating at 900° C. for 30 minutes, dopant atoms diffuse so strongly that the dimensions of the base zone and the emitter zone increase so much that even signals having a frequency of 5 GHz cannot be processed anymore.

Figure 8:
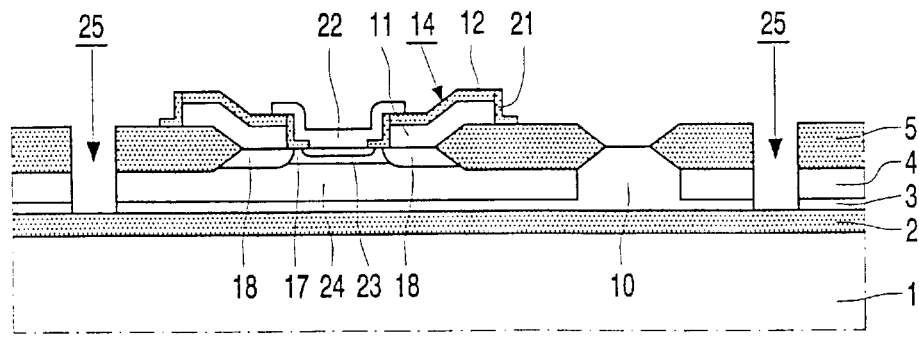
Figure 9:
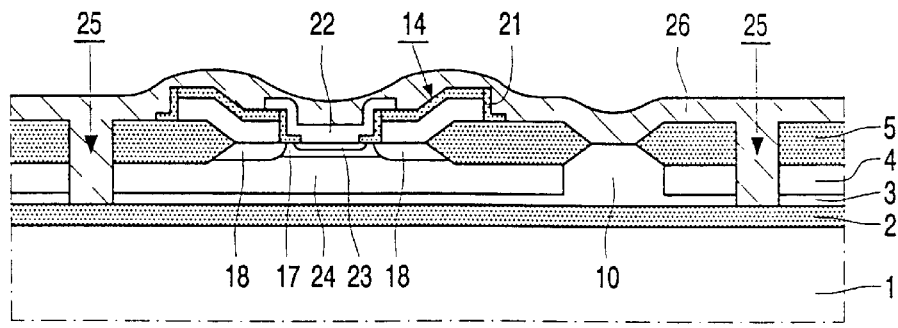
Figure 10:
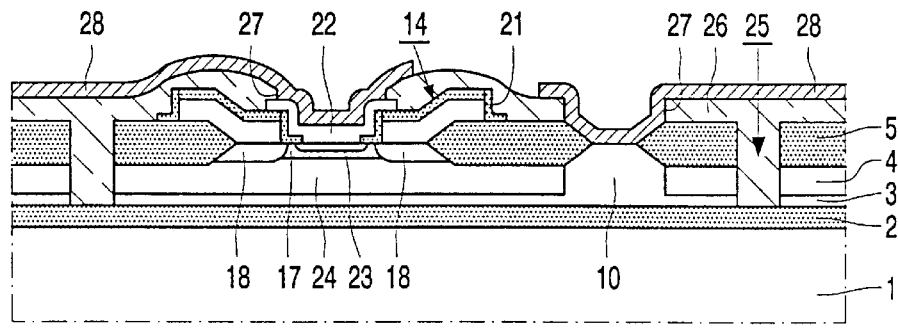
Figure 11:
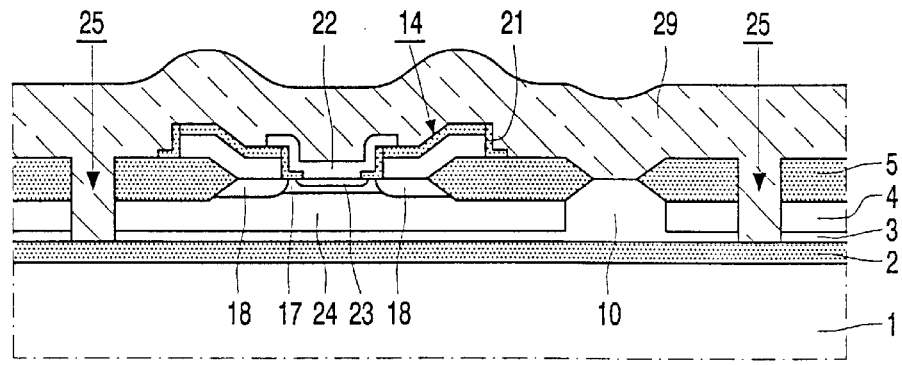
FIGS. 11 through 13 are diagrammatic, cross-sectional views of a few stages in the manufacture of a second example of a semiconductor device comprising a bipolar transistor, using the method in accordance with the invention.
Figure 12:
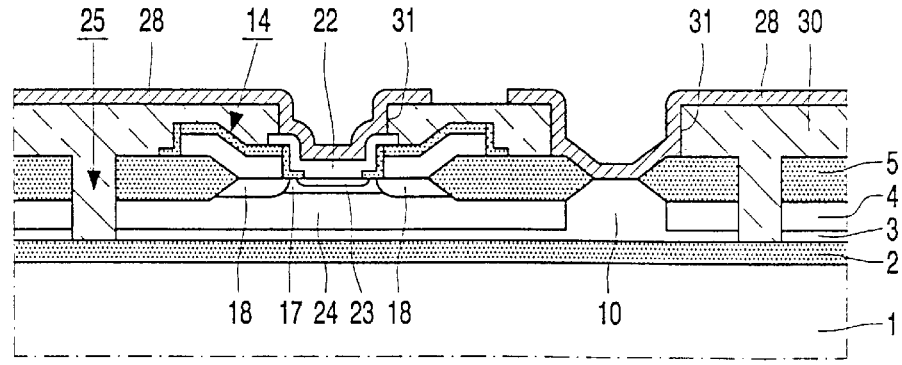

In a second example, which is identical to the first example up to and including the situation shown in FIG. 8, the trenches 25, as shown in FIGS. 11 and 12, are filled by depositing, in and next to the trenches 25, a layer of silicon oxide 29 on the wafer from a plasma generated in a vapor of components containing silicon and oxygen. An example of such a plasma is a plasma generated in a vapor of silane and laughing gas. When such a layer is deposited, the wafer is heated to a temperature of 400° C. This method has the additional advantage that, apart from the semiconductor elements, the layer can also be provided with passive elements, not shown, such as capacitors and coils. These passive elements are insulated from the underlying silicon wafer by the silicon oxide layer thus deposited.

The deposited silicon oxide layer 29 is planarized by means of a chemical-mechanical polishing process. In such a process, which is carried out at room temperature, the wafer is not heated. After the formation of contact windows 31, the metallization 28 and said passive elements can be readily formed on the layer 30 thus planarized.

Figure 13:
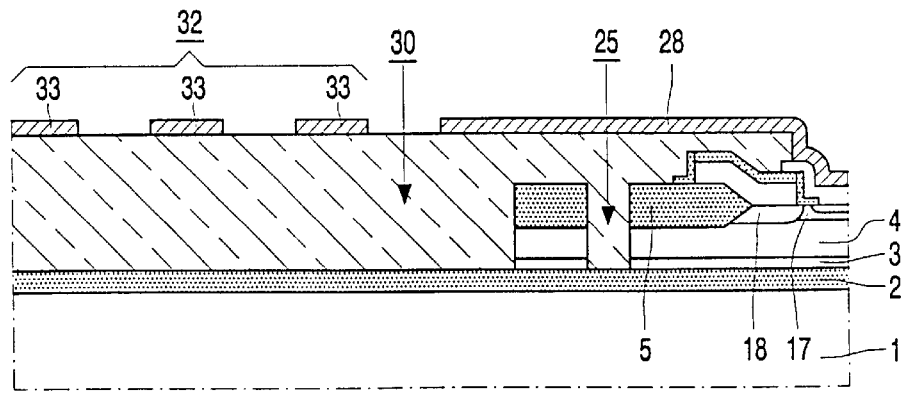

Preferably, as shown in FIG. 13, the buried insulating layer 2 is exposed at the location of the passive elements, in this example a coil 32, prior to the deposition of the layer of silicon oxide 29, in the same process step as that in which the trenches 25 are formed; the top layer 4 as well as the underlying layer 3 are removed from the insulating buried layer 2. The passive elements are thus provided on a layer of planarized silicon oxide 30 which, at the location of these passive elements, is directly provided on the insulating buried layer 2. Due to the absence of doped silicon layers, i.e. the top layer 4 and the layer 3, these passive elements will exhibit an improved high-frequency behavior as compared to that of passive elements formed at locations where the top layer 4 and the layer 3 are not removed. For example, coils will exhibit a higher quality factor. The coil 32 shown herein has windings 33 which are formed in the metal layer of the conductor tracks 28.

FIGS. 14 through 20 are diagrammatic, cross-sectional views of a few stages in the manufacture of a MOS transistor. In the Figures, corresponding parts bear the same reference numerals as in FIGS. 1 through 13 whenever possible. In the FIGS. 14 through 20, the manufacture of a single transistor is shown, but it will be clear that, in practice, a semiconductor device may comprise a very large number of these transistors. In this method, the starting material used is a wafer of silicon 1 comprising a layer of an insulating material 3 buried in the wafer, in this case a buried layer of silicon oxide on which an approximately 500 nm thick monocrystalline top layer 4 is situated. In this example, the top layer 4 is n-type doped with approximately $5.10^{17}$ atoms per cc, said doping serving as a doping of the gate zone of the transistor to be formed.

Also in this example, 2 approximately 500 nm thick oxide regions 5 are formed first, in a customary manner, by means of local oxidation of the top layer. These oxide regions 5 enclose an active region 34 for the transistor to be formed. In the formation of the oxide regions 5, the wafer 1 is heated in vapor for 1 hour to a temperature of 1000° C. after an oxide mask, not shown, has been formed in a customary manner on the top layer.

Figure 14:
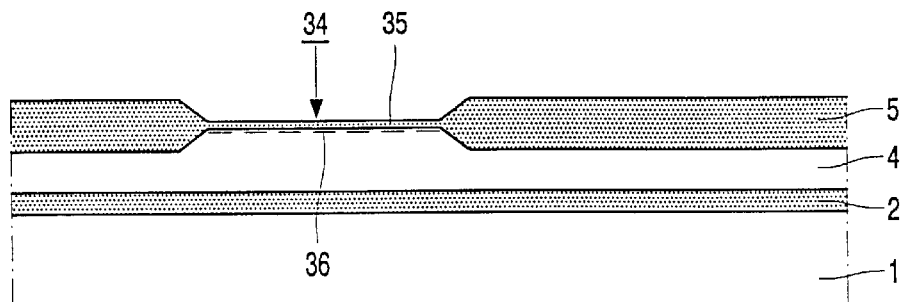
FIGS. 14 through 20 are diagrammatic, cross-sectional views of a few stages in the manufacture of a semiconductor device comprising a MOS transistor, using the method in accordance with the invention.

Subsequently, an approximately 20 nm thick gate oxide layer 35 is formed on the active region 34 by thermal oxidation of the top layer 2. Next, as shown in FIG. 14 by means of a dotted line 36, approximately $10^{12}$ boron ions per $cm^2$ are implanted at a very small depth of approximately 50 nm. This implantation should enable a MOS transistor having a desired threshold voltage to be realized.

After this threshold-voltage implantation 36, an n-type doped layer of polycrystalline silicon 37 and a silicon oxide layer 38 are deposited by means of a customary CVD process in which the wafer is heated to a temperature of approximately 700° C. A pattern of conductor tracks 39 with a gate electrode 40 is subsequently etched in these two layers.

Figure 15:
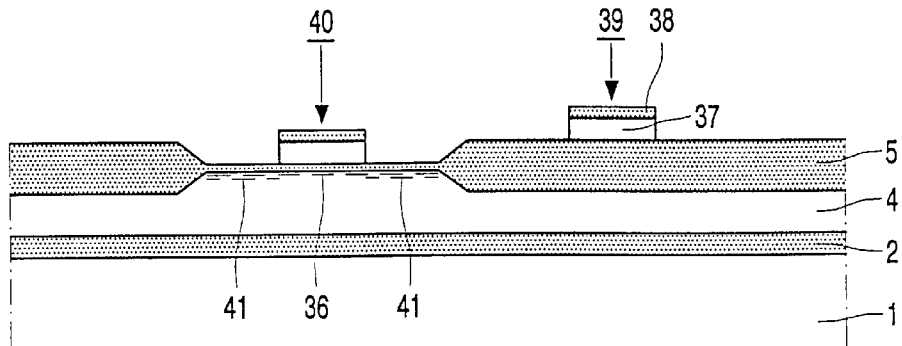
Figure 16:
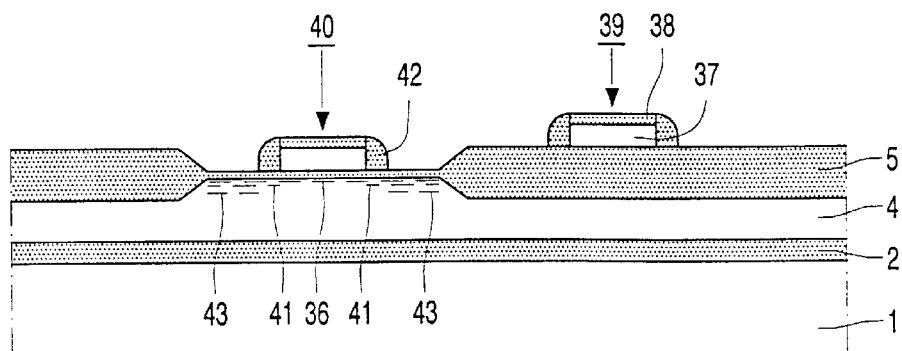
Figure 17:
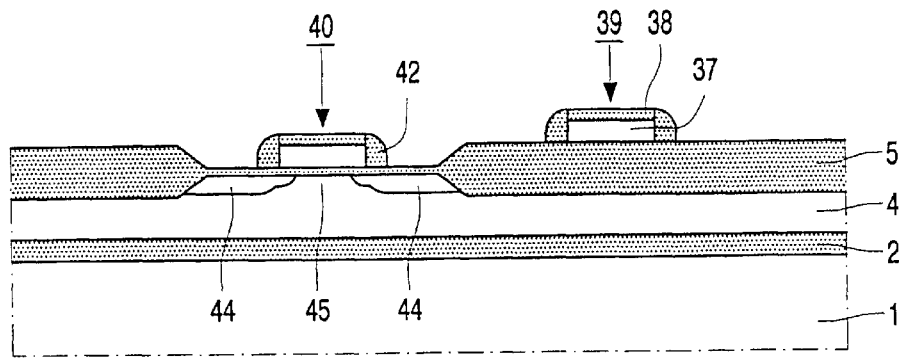

Using the gate electrode 40 and the silicon oxide regions 5 as a mask, approximately $10^{13}$ arsenic ions per $cm^2$ are implanted in the top layer 2, as indicated by means of dotted lines 41 in FIG. 15. After the conductor tracks 39 and the gate electrode 40 are provided with silicon oxide spacers 42 in a customary manner, approximately $10^{15}$ arsenic ions per $cm^2$ are implanted in the top layer 2, as indicated by means of a dotted line 43 in FIG. 16. By means of a heat treatment, in which the wafer is heated to 900° C. for approximately 30 minutes, all implanted ions are activated, thereby forming the source and drain zones 44. The part 45 of the top layer 4 situated between the source and drain zones 44 forms the gate zone of the MOS transistor.

Figure 18:
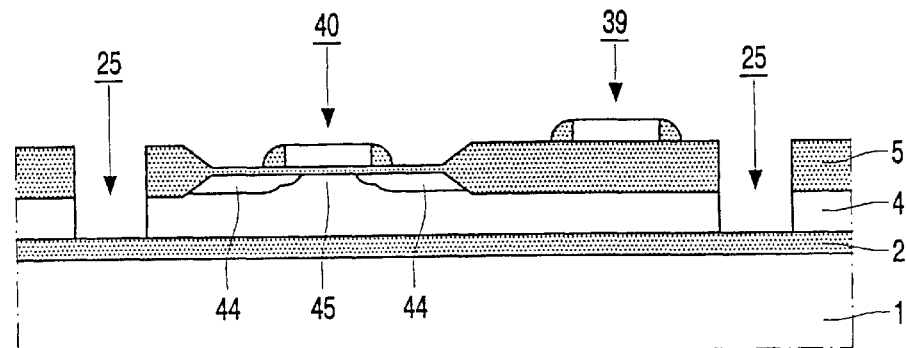
Figure 19:
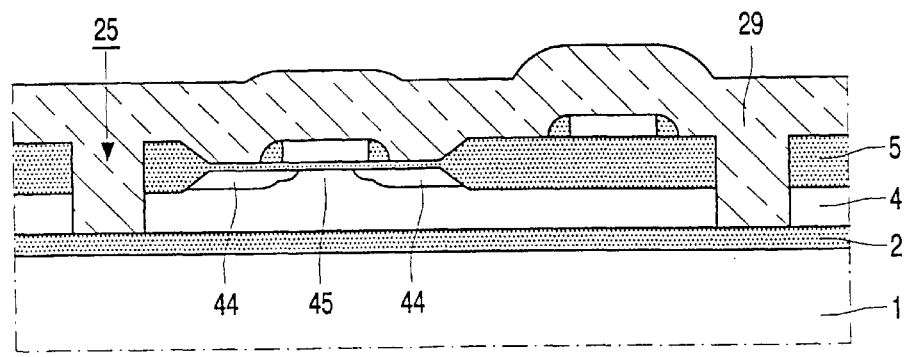
Figure 20:
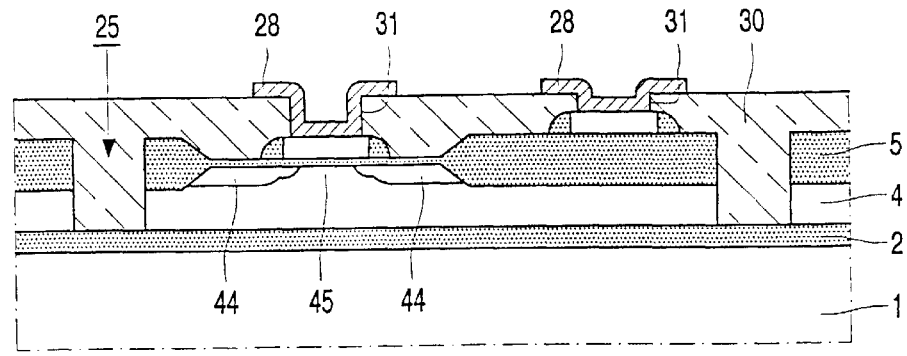

After these "front-end" process steps, wherein the wafer was heated several times to temperatures of 700° C. and higher, trenches 25 are formed which, as shown in FIGS. 18 and 19, are filled with insulating material in the same manner as in the second example of the bipolar transistor, as shown in FIGS. 11 and 12. Before the layer 29 is deposited, the silicon oxide layer 38, as shown in FIG. 18, is locally removed from the conductor tracks 39 and the gate electrode 44. After planarizing the layer 29, the layer 30 is provided with the metallization 28 after contact windows 31 have been formed in said layer 30.

Also in this example, the wafer 1 is not heated to temperatures above 500° C. after the "front-end" processes have been carried out. In this manner, also in this example, very small semiconductor zones having a very small and well-defined depth can be formed.

What is claimed is:

1. A method of manufacturing a semiconductor device comprising semiconductor elements having semiconductor zones formed in a silicon wafer's monocrystalline top layer situated on a buried insulating layer, in which method a first series of process steps is carried out, inter alia, process steps wherein the wafer is heated to a temperature above 700° C., whereafter trenches are formed in the top layer which extend as far as the buried insulating layer and which do not intersect pn-junctions, which trenches are subsequently filled with an insulating material, after which a second series of process steps is finally carried out, wherein the semiconductor device is completed, in which second series of process steps the wafer does not exceed a temperature of 400° C., characterized in that the trenches are filled with an insulating material by means of a deposition process in which the wafer is not heated to a temperature above 500° C.

2. A method as claimed in claim 1, characterized in that the trenches are filled by depositing, in the trenches and next to the trenches, a layer of a synthetic resin on the wafer, whereafter windows are formed in this layer, which serve to make contact with a semiconductor element situated under the layer.

3. A method as claimed in claim 2, characterized in that the synthetic resin layer deposited in and next to the trenches is a layer of benzocyclobutene.

4. A method as claimed in claim 1, characterized in that the trenches are filled by depositing, in the trenches and next to the trenches, a silicon oxide layer on the wafer from a plasma generated in a vapor of silicon and oxygen-containing components.

5. A method of manufacturing a semiconductor device comprising semiconductor elements having semiconductor zones formed in a silicon wafer's monocrystalline top layer situated on a buried insulating layer, in which method a first series of process steps is carried out, inter alia, process steps wherein the wafer is heated to a temperature above 700° C., whereafter trenches are formed in the top layer which extend as far as the buried insulating layer and which do not intersect pn-junctions, which trenches are subsequently filled with an insulating material, after which a second series of process steps is finally carried out, wherein the semiconductor device is completed, in which second series of process steps the wafer does not exceed a temperature of 400° C., characterized in that the trenches are filled with an insulating material by means of a deposition process in which the wafer is not heated to a temperature above 500° C., and wherein the trenches are filled by depositing, in the trenches and next to the trenches, a silicon oxide layer on the wafer from a plasma generated in a vapor of silicon and oxygen-containing components, and wherein the deposited layer of silicon oxide is planarized by means of a chemical-mechanical polishing process.

6. A method as claimed in claim 5, characterized in that, in addition to the semiconductor elements, passive elements are provided on the silicon oxide layer, and, at the location of the passive elements, the insulating buried layer is exposed in the process step wherein the trenches are formed, prior to the deposition of the silicon dioxide layer.

* * * * *